(12) United States Patent
Ikeda et al.

(10) Patent No.: US 7,528,049 B2
(45) Date of Patent: May 5, 2009

(54) METHOD FOR MANUFACTURING BONDED SOI WAFER AND BONDED SOI WAFER MANUFACTURED THEREBY

(75) Inventors: Yasunobu Ikeda, Tokyo (JP); Shinichi Tomita, Tokyo (JP); Hiroyuki Miyahara, Tokyo (JP)

(73) Assignee: Sumco Corporation, Tokyo (JP)

( * ) Notice: Subject to any disclaimer, the term of this patent is extended or adjusted under 35 U.S.C. 154(b) by 154 days.

(21) Appl. No.: 11/878,255

(22) Filed: Jul. 23, 2007

(65) Prior Publication Data

US 2008/0020541 A1  Jan. 24, 2008

(30) Foreign Application Priority Data

Jul. 24, 2006 (JP) .............................. 2006-200958

(51) Int. Cl.
*H01L 21/00* (2006.01)
(52) U.S. Cl. ........................ 438/406; 438/455; 257/607
(58) Field of Classification Search ................ 438/405, 438/455; 257/607
See application file for complete search history.

(56) References Cited

U.S. PATENT DOCUMENTS

| | | | |
|---|---|---|---|
| 5,897,362 A | | 4/1999 | Wallace |
| 6,153,495 A * | | 11/2000 | Kub et al. .................. 438/459 |
| 6,194,290 B1 * | | 2/2001 | Kub et al. .................. 438/455 |
| 6,274,892 B1 * | | 8/2001 | Kub et al. .................. 257/131 |
| 6,959,854 B2 * | | 11/2005 | Yokokawa et al. .......... 228/201 |
| 7,084,459 B2 * | | 8/2006 | Sasaki et al. ................ 257/347 |
| 7,485,928 B2 * | | 2/2009 | Falster et al. ................ 257/347 |
| 2002/0024152 A1 | | 2/2002 | Momoi et al. |
| 2004/0018363 A1 * | | 1/2004 | Sasaki et al. ................ 428/446 |
| 2004/0135208 A1 * | | 7/2004 | Tanahashi et al. ........... 257/368 |
| 2006/0091394 A1 * | | 5/2006 | Honda .......................... 257/66 |
| 2006/0118868 A1 | | 6/2006 | Yoshimura et al. |
| 2007/0066033 A1 * | | 3/2007 | Kurita et al. ................ 438/473 |
| 2008/0020541 A1 * | | 1/2008 | Ikeda et al. ................. 438/406 |
| 2008/0296724 A1 * | | 12/2008 | Yamazaki et al. ........... 257/506 |
| 2008/0318367 A1 * | | 12/2008 | Shimomura et al. ......... 438/151 |
| 2009/0004821 A1 * | | 1/2009 | Shimomura et al. ......... 438/458 |

FOREIGN PATENT DOCUMENTS

| | | |
|---|---|---|
| EP | 1 187 216 A1 | 3/2002 |
| EP | 1 381 086 A1 | 1/2004 |
| JP | 5-55230 | 3/1993 |
| JP | 3217089 | 8/2001 |

\* cited by examiner

*Primary Examiner*—Laura M Menz
(74) *Attorney, Agent, or Firm*—Clark & Brody

(57) ABSTRACT

A bonded SOI wafer is manufactured by performing bonding in a state where organics exist on a surface of an active layer wafer and/or on a surface of a supporting wafer and performing heat-treating for bonding reinforcement in a state where the organics are trapped at an interface between the active layer wafer and the supporting wafer to form crystal defects at an interface between the active layer wafer and an oxide film and/or at an interface between the supporting wafer and the oxide film. This allows a simple and inexpensive gettering source to be formed at the interface between an SOI layer and an insulating layer (oxide film). Also, the bonded SOI wafer of the present invention that is manufactured by this method can effectively remove heavy-metal impurities that may have a negative impact on the characteristics of the device and/or the withstand voltage characteristics of the oxide film. Therefore, the manufacturing method and the bonded SOI wafer according to the present invention can be utilized widely as an SOI wafer with improved device characteristics or as a manufacturing method thereof.

24 Claims, 6 Drawing Sheets

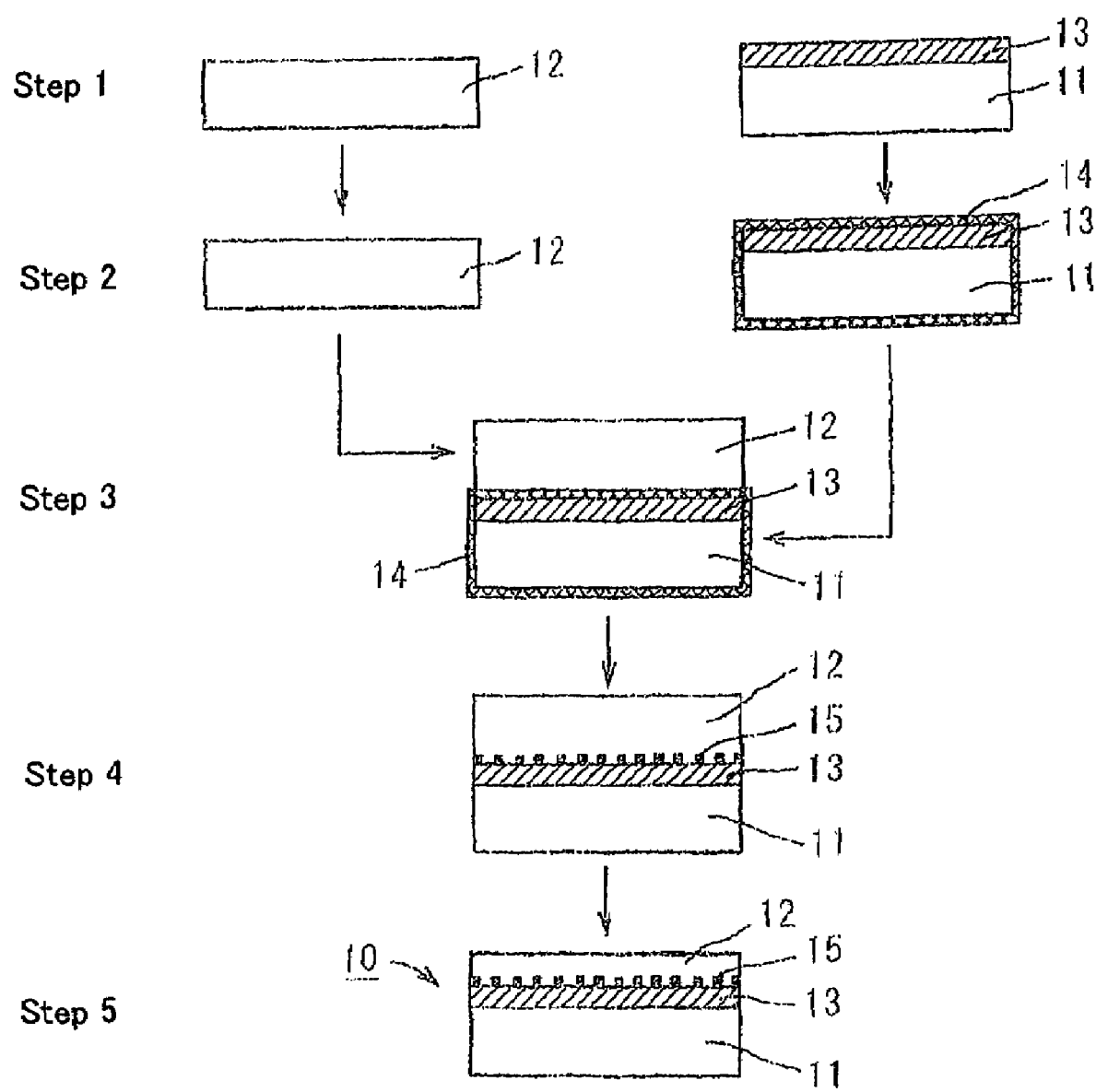

METHOD FOR MANUFACTURING BONDED SOI WAFER AND BONDED SOI WAFER MANUFACTURED THEREBY

FIELD OF THE INVENTION

The present invention relates to a method for manufacturing a bonded SOI wafer having a gettering layer for removing process-induced heavy-metal impurities that may have a negative impact on the device operation, and also relates to bonded SOI wafers manufactured by the method.

DESCRIPTION OF THE RELATED ART

With the advances in miniaturization and high-density integration of semiconductor devices, wafer contamination has an increasing impact on the characteristics of the devices. Gettering techniques have conventionally been used to remove process-induced contamination subjected in wafer processing and/or device manufacturing processes, particularly heavy-metal impurities, from the active regions of the integrated circuits.

Well-known gettering techniques include, for example, depositing polycrystalline silicon on the rear surface of a semiconductor substrate by a low-pressure CVD method to use a deposited silicon as a gettering source and utilizing heavy-metal impurities trapping capability due to oxygen precipitates or crystal defects such as dislocations.

There are many examples in which the gettering in conventional semiconductor substrates is applied to SOI (Silicon On Insulator) wafers each with an SOI layer formed on an insulator. However, for SOI wafers, an insulating layer such as an oxide film provided between an SOI layer and a Si supporting substrate disturbs the movement of heavy-metal impurities, resulting in an insufficient gettering effect.

For this reason, it becomes necessary for effective provision of a gettering source to employ a structure in which a gettering source is formed at the interface between the SOI layer and the insulating layer (oxide film) and the provided gettering source has no negative impact on the device region. However, SOI wafers go through very complicated manufacturing processes and thereby require significantly higher production costs than typical wafers, and thus adding a further process of providing a gettering source results in a further increase in production cost of SOI wafers.

For example, Japanese Patent No. 3217089 discloses a method for manufacturing an SOI wafer in which carbon ions are implanted into an oxide film on a supporting substrate (supporting wafer) and the surface of the oxide film is bonded with an SOI layer substrate to subsequently be heat-treated so that oxygen is precipitated with carbons as nucleus at the interface between the oxide film and the SOI layer substrate. However, this method requires processes of implanting carbon ions into the oxide film on the supporting substrate and heat-treating for formation and growth of precipitation nuclei after bonding, which also results inevitably in an increase in production cost.

SUMMARY OF THE INVENTION

It is an object of the present invention to provide a methods for manufacturing a bonded SOI wafer having a simple and inexpensive gettering source formed at the interface between an SOI layer and an insulating layer (oxide film) and having a function of effectively removing heavy-metal impurities that may deteriorate the characteristics of the device and/or the withstand voltage characteristics of the oxide film, and also to provide a bonded SOI wafer manufactured by this method.

In order to achieve the foregoing object, the inventors have made studies on the method of providing a gettering source in conventional SOI wafer manufacturing processes without adding a further process to consequently find that bonding in a state where organics exist on the surface of a wafer before bonding allows micro crystal defects having a gettering effect to be formed at the bonded interface in the subsequent heat treatment for bonding reinforcement.

The present invention has been made based on the finding above, and the gist thereof resides in (1) a method for manufacturing a bonded SOI wafer and (2) a bonded SOI wafer manufactured thereby, as described below.

(1) A method for manufacturing a bonded SOI wafer in which an active layer wafer intended to be an SOI layer and a supporting wafer are bonded via an oxide film therebetween and then said active layer wafer is thinned so that said SOI layer is formed on said oxide film, wherein bonding is performed in a state where organics exist on a surface of an active layer wafer and/or on a surface of a supporting wafer and heat-treating for bonding reinforcement is performed in a state where said organics are trapped at an interface between said active layer wafer and said supporting wafer to form crystal defects at an interface between said active layer wafer and said oxide film and/or at an interface between said supporting wafer and said oxide film.

The above-mentioned term "crystal defects" means carbon (C)-induced micro crystal defects generated through bonding and heat-treating for bonding reinforcement in a state where organics exist on the surface of at least one wafer and thereby decomposition of the organics takes place. It is noted that the existence of carbons at the bonded interface where crystal defects are formed can be verified by secondary ion mass spectrometry (SIMS), while the existence of carbons at the bonded surface can be verified by gas chromatography mass spectrometry (GC-MS), etc.

Also, the "state where organics exist" means the state where organics are contained in a natural oxide film formed on the surface of the active layer wafer and/or on the surface of the supporting wafer when cleaning or dry-storing the wafer, or the state where organics are attached to the surface of the active layer wafer and/or to the surface of the supporting wafer during cleaning or drying and storing.

In the method for manufacturing a bonded SOI wafer, the state where organics exist on the surface of the active layer wafer and/or on the surface of the supporting wafer may be obtained by cleaning the surface of the active layer wafer and/or the surface of the supporting wafer in an atmosphere containing the organics.

In the method for manufacturing a bonded SOI wafer, the state where organics exist on the surface of the active layer wafer and/or on the surface of the supporting wafer may also be obtained by drying the active layer wafer and/or the surface of the supporting wafer after cleaning in an atmosphere containing the organics.

In the method for manufacturing a bonded SOI wafer, the state where organics exist on the surface of the active layer wafer and/or on the surface of the supporting wafer may further be obtained by treating the surface of the active layer wafer and/or the surface of the supporting wafer with a cleaning solvent containing the organics.

In the method for manufacturing a bonded SOI wafer, the state where organics exist on the surface of the active layer wafer and/or on the surface of the supporting wafer may also be obtained by applying or dripping a treating solvent containing the organics onto the surface of the active layer wafer and/or onto the surface of the supporting wafer.

(2) A bonded SOI wafer manufactured by the method according to (1) (including the above-described embodiments of the method), wherein the bonded interface includes carbon-induced micro crystal defects.

In the bonded SOI wafer, the crystal defects may have a size of 5 to 50 nm. That is, the crystal defects are extremely small. It is noted that the "size of crystal defects" herein means the size recognizable from an image taken when observing crystal defects in a transmission electron microscope (TEM) as the maximum length of each defect (refer to FIGS. 4A and 4B below).

Also, in the bonded SOI wafer, a carbon concentration peak of $5 \times 10^{18}$ atoms/cm$^3$ or more may be detected at an interface between the active layer wafer and the oxide film and/or at an interface between the supporting wafer and the oxide film. The "carbon concentration peak" herein means the result of measuring the bonded interface by secondary ion mass spectrometry (SIMS) (refer to FIG. 5 below).

As mentioned above, in the method for manufacturing a bonded SOI wafer according to the present invention, the active layer wafer and the supporting wafer are bonded and heat-treated for bonding reinforcement in a state where organics exist on the surface of at least one of the wafers, so that crystal defects are formed at an interface between the active layer wafer and the oxide film and/or at an interface between the supporting wafer and the oxide film. In accordance with the manufacturing method according to the present invention, a simple and inexpensive gettering source can be formed at the interface between the SOI layer and the insulating layer (oxide film).

In the bonded SOI wafer according to the present invention that is manufactured by the manufacturing method, the bonded interface includes carbon-induced micro crystal defects, which allows heavy-metal impurities that may have a negative impact on the characteristics of the device and/or the withstand voltage characteristics of the oxide film to be removed effectively.

BRIEF DESCRIPTION OF THE DRAWINGS

FIG. 3 is a flow chart schematically showing yet another example of principal steps in the method for manufacturing a bonded SOI wafer according to the present invention;

FIG. 4A shows the case where N-methyl-2-pyrrolidone is contained in an atmosphere for cleaning the wafer while FIG. 4B shows the case where no N-methyl-2-pyrrolidone is contained;

DETAILED DESCRIPTION OF THE PREFERRED EMBODIMENTS

A method for manufacturing a bonded SOI wafer according to the present invention and a bonded SOI wafer according to the present invention that is manufactured by the method will hereinafter be described specifically with reference to the accompanying drawings.

The method for manufacturing a bonded SOI wafer according to the present invention is characterized in that when an active layer wafer to be an SOI layer and a supporting wafer are bonded via an oxide film therebetween, the bonding is performed in a state where organics exist on the surface of the active layer wafer and/or on the surface of the supporting wafer and heat-treating for bonding reinforcement is performed in a state where the organics are trapped at an interface between the active layer wafer and the supporting wafer to form crystal defects at an interface between the active layer wafer and the oxide film and/or at an interface between the supporting wafer and the oxide film.

Figure 1:
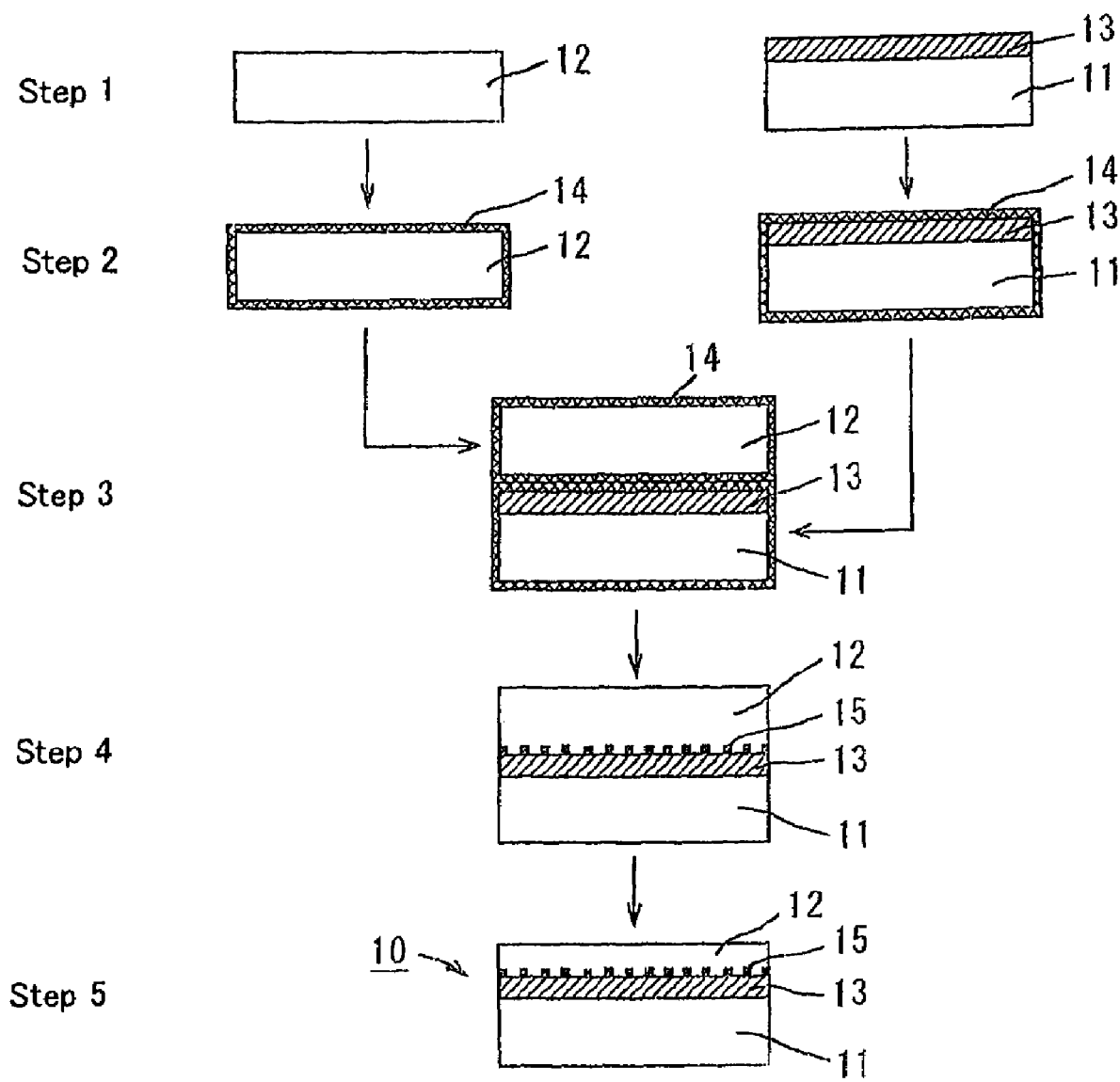
FIG. 1 is a flow chart schematically showing an example of principal steps in the method for manufacturing a bonded SOI wafer according to the present invention.

FIG. 1 is a flow chart schematically showing an example of principal steps in the method for manufacturing a bonded SOI wafer according to the present invention. The flow chart will hereinafter be described from Step 1 through Step 5.

In Step 1, an active layer wafer 12 to be an SOI layer and a supporting wafer 11 with an oxide film (insulating layer) 13 formed on the surface thereof are prepared. These wafers may be produced by any conventional method.

In Step 2, for the bonding of the active layer wafer 12 and the supporting wafer 11, organics are provided, that is, a natural oxide film 14 containing carbons is formed on the surface of the active layer wafer and/or on the surface of the supporting wafer (here indicating both the active layer wafer 12 and the supporting wafer 11). As for the supporting wafer 11, the natural oxide film 14 is formed also on the oxide film 13.

This is for forming crystal defects that serve as a gettering source at the bonded interface in the following heat treatment for bonding reinforcement. The details will be described in Step 4.

Specific methods for obtaining the state where the organics exist on the surfaces of the wafers include, for example, cleaning in an atmosphere containing the organics (including subsequent drying), treating with a cleaning solvent containing the organics, applying or dripping a treating solvent containing the organics, and leaving the wafers in an atmosphere containing the organics, said any method being effective.

Among the methods above, the method of cleaning the surfaces of the wafers in an atmosphere containing the organics will be described. In manufacturing a bonded SOI wafer, pre-bonding cleaning such as SC-1 cleaning that uses a solution of ammonium hydroxide and hydrogen peroxide solution is performed before bonding wafers to remove impurities on the surfaces, and in this case, the cleaning is performed in such an atmosphere.

Aromatic hydrocarbons, chlorohydrocarbons, alcohols, acetate esters, ketones, or ethers may be used as the organics, and also may contain small amounts of carbons, where N-methyl-2-pyrrolidone is particularly suitable. N-methyl-2-pyrrolidone is readily available as a remover for removing wax, the wax being used for scratch prevention when grinding wafers in wafer processing, and is easily absorbed onto the surfaces of wafers.

The pre-bonding cleaning in such an atmosphere containing organics allows the organics to exist on the surfaces of the wafers. The attachment (existence) of extremely small amounts of organics onto the surfaces of the wafers is expected to exhibit an effect of forming crystal defects at the interface between the active layer wafer and the oxide film and/or at the interface between the supporting wafer and the oxide film.

Table 1 shows measurement results of the total amounts of organics attached onto the surface of each wafer after SC-1 cleaning in an atmosphere containing N-methyl-2-pyrrolidone as organics. The amounts of organics are measured by gas chromatography mass spectrometry (GC-MS). It is noted that about 80% of the total amounts of attached organics are N-methyl-2-pyrrolidone. Also, in Table 1, the term "with an oxide film of 0.5 μm" means that an oxide film (insulating layer) having a thickness of 0.5 μm is formed on the surface of each wafer.

TABLE 1

| No. | Sample name | Cleaning atmosphere | Total amounts of attached organics (ng/cm$^2$) |
|---|---|---|---|
| 1 | SC-1 cleaned wafer | N-methyl-2-pyrrolidone contained | 3.5 |
| 2 | SC-1 cleaned wafer (with an oxide film of 0.5 μm) | | 3.9 |
| 3 | SC-1 cleaned wafer | N-methyl-2-pyrrolidone not contained | 0.009 |
| 4 | SC-1 cleaned wafer (with an oxide film of 0.5 μm) | | 0.027 |

It is found from Table 1 that over 100 times more organics (i.e. N-methyl-2-pyrrolidone) are detected at the surfaces of the wafers cleaned in an atmosphere containing N-methyl-2-pyrrolidone (sample Nos. 1 and 2) than the wafers cleaned in an atmosphere containing no N-methyl-2-pyrrolidone (sample Nos. 3 and 4). It is also found that the amount of attached N-methyl-2-pyrrolidone is less likely to be affected by the existence of the oxide film (insulating layer).

In the next Step 3, the active layer wafer 12 with organics existing on the surface thereof, that is, with the natural oxide film 14 containing carbons formed thereon is bonded with the supporting wafer 11 with the natural oxide film 14 containing carbons formed similarly thereon via the oxide film 13 on the supporting wafer 11. This results in a state where the organics are trapped at the bonding interface.

In Step 4, heat-treating for bonding reinforcement is performed in the state where the organics are thus trapped at the bonding interface. This heat treatment is for ensuring bonding strength as well as forming micro crystal defects at the interface between the active layer wafer and the oxide film and/or at the interface between the supporting wafer and the oxide film. The treatment temperature is preferably 1100 degrees C. or more to achieve an effect that the oxide film is softened to fill voids. It is noted that the upper limit of the treatment temperature is preferably 1300 degrees C. from the viewpoint of preventing slip dislocations.

The natural oxide film containing small amounts of organics (carbons) at the bonded interface is coagulated locally through the treatment above. The small amounts of organics (carbons) coagulated in association with the local coagulation of the natural oxide film form micro crystal defects 15 having a size of 50 nm or less. It is considered that these crystal defects 15 are composed of "Carbon-Si".

Figure 4A:
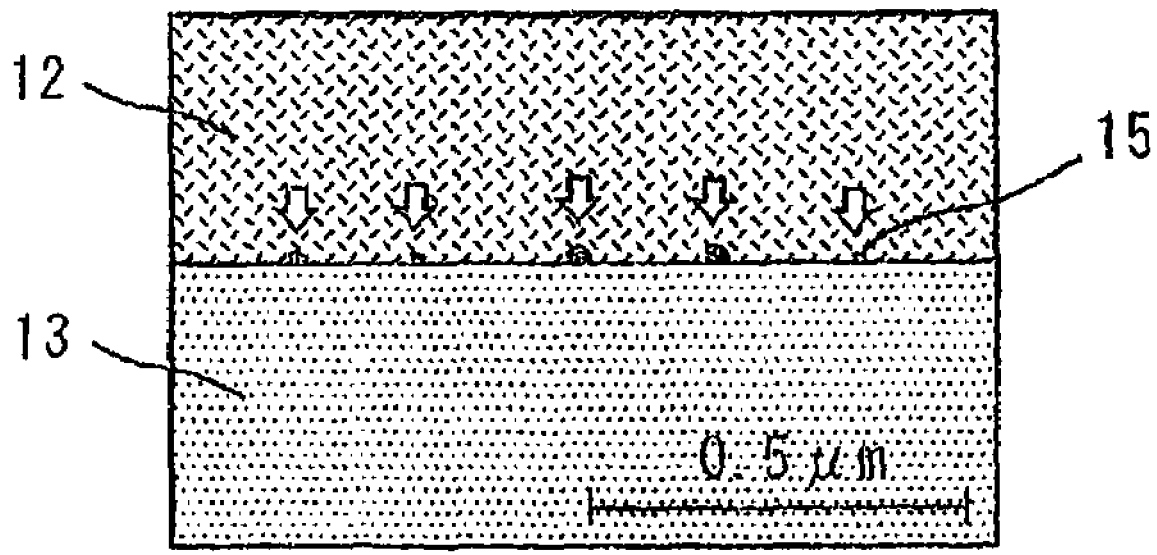
FIGS. 4A and 4B are schematic views showing observations of bonded interfaces (cross sections) after heat treatment for bonding reinforcement using a transmission electron microscope (TEM), where
Figure 4B:
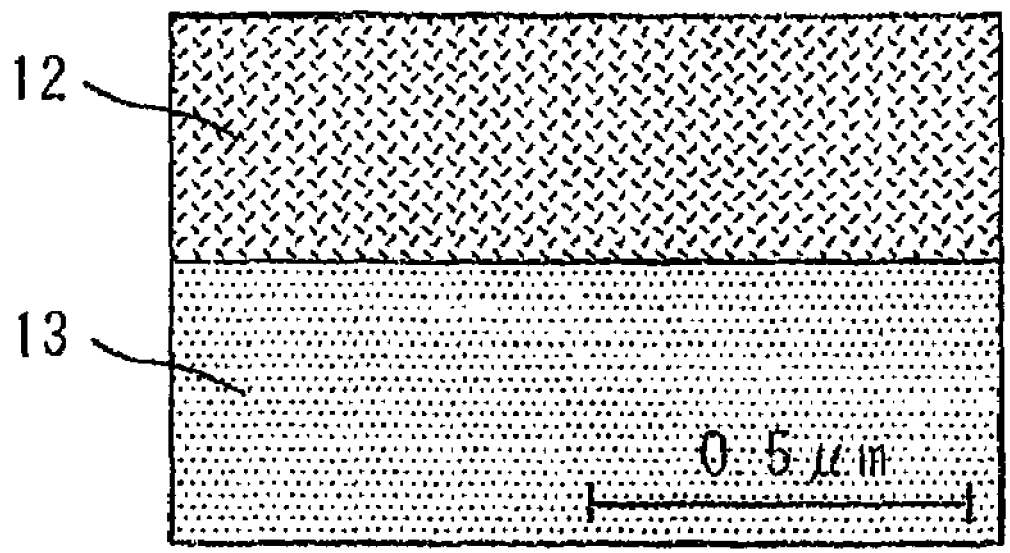

FIGS. 4A and 4B are schematic views showing observations of bonded interfaces (cross sections) after heat treatment for bonding reinforcement using a transmission electron microscope (TEM), where FIG. 4A shows the case where N-methyl-2-pyrrolidone is contained in an atmosphere for cleaning the wafer while FIG. 4B shows the case where no N-methyl-2-pyrrolidone is contained.

As indicated by the outline arrows in FIG. 4A, if N-methyl-2-pyrrolidone is contained in the atmosphere for cleaning the wafer, micro crystal defects 15 are formed through heat treatment at the bonded interface between the active layer wafer (SOI layer) 12 and the oxide film 13. The size of the faults is considered to be about 50 nm or less by comparison with the scale indicating a length of 0.5 μm shown in the drawing. On the contrary, if no N-methyl-2-pyrrolidone is contained in the atmosphere, no crystal fault is formed as shown in FIG. 4B.

Figure 5:
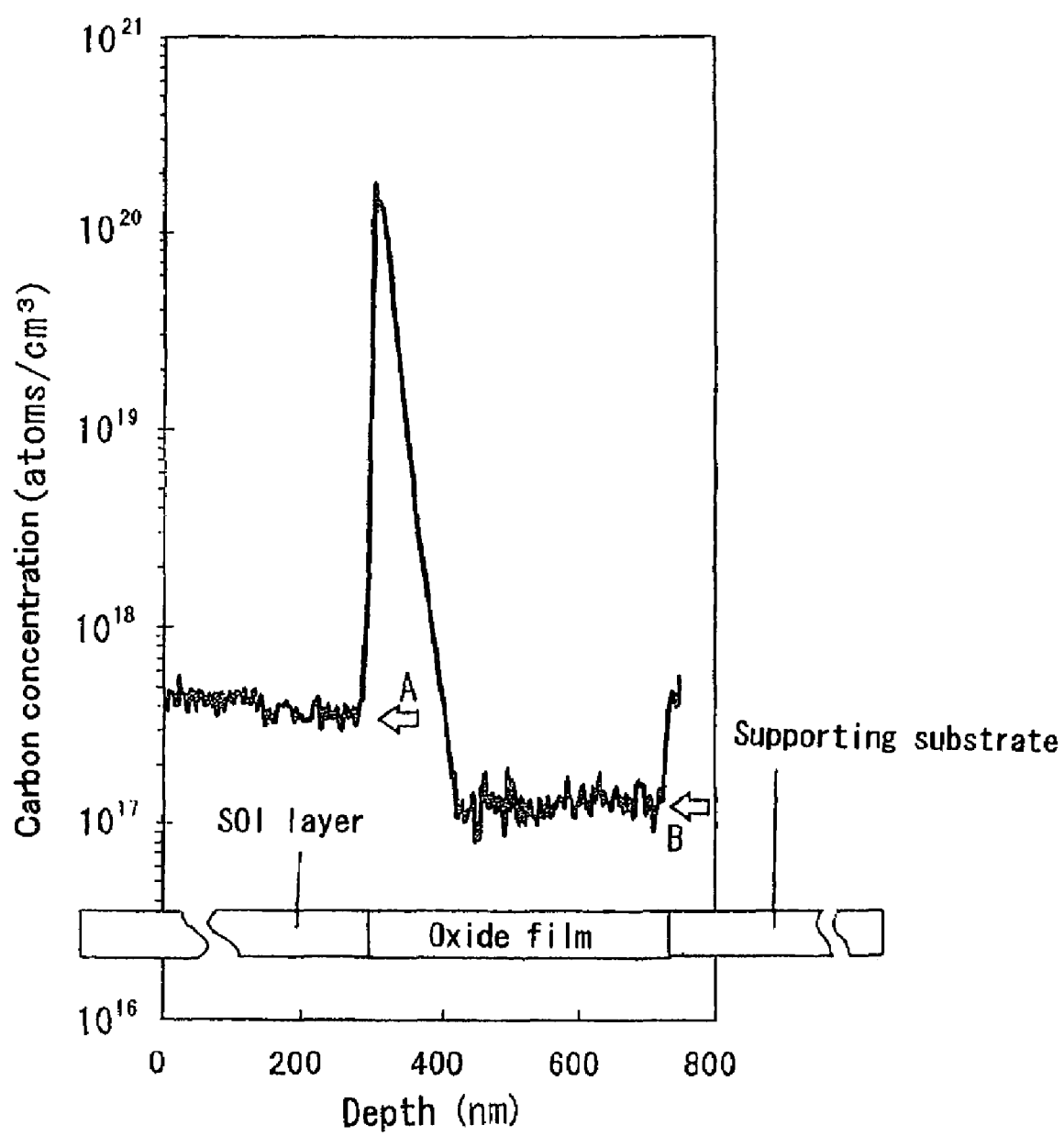
FIG. 5 shows a profile of carbon (C) concentration in the vicinity of the bonded interface after heat treatment for bonding reinforcement measured by secondary ion mass spectrometry (SIMS) in the case where N-methyl-2-pyrrolidone is contained in an atmosphere for cleaning the wafer.
Figure 6:
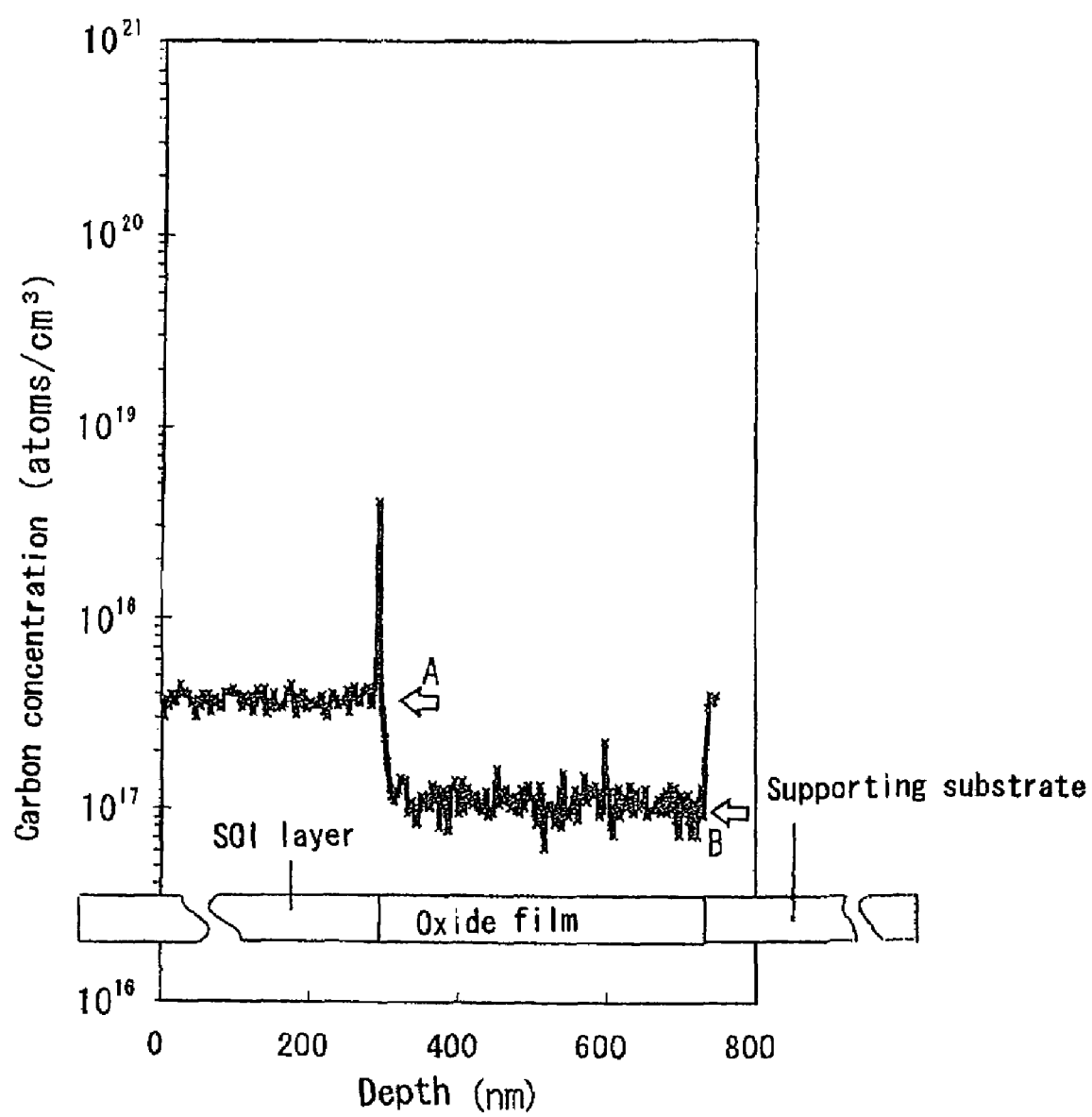
FIG. 6 shows a profile of carbon (C) concentration in the vicinity of the bonded interface after heat treatment for bonding reinforcement measured by secondary ion mass spectrometry (SIMS) in the case where no N-methyl-2-pyrrolidone is contained in an atmosphere for cleaning the wafer.

FIGS. 5 and 6 are also findings obtained in the practical examples, showing profiles of carbon (C) concentration in the vicinity of the bonded interface after the heat treatment for bonding reinforcement measured by secondary ion mass spectrometry (SIMS). FIG. 5 shows the case where N-methyl-2-pyrrolidone is contained in the atmosphere for cleaning the wafer, while FIG. 6 shows the case where no N-methyl-2-pyrrolidone is contained.

In FIGS. 5 and 6, the horizontal axis represents the distance (defined as "depth" here) from the active layer wafer (SOI layer) toward the supporting wafer in a bonded SOI wafer after heat treatment for bonding reinforcement. The observed regions of the SOI layer, oxide film, and supporting wafer (supporting substrate) are shown in each drawing along the horizontal axis. The vertical axis represents carbon concentration (atoms/cm$^3$). Also, the carbon concentration indicated by the outline arrow A is a background level in the wafer, while the carbon concentration indicated by the outline arrow B is a background level in the oxide film (insulating layer).

It is found from FIG. 5 that if N-methyl-2-pyrrolidone is contained in the atmosphere for cleaning the wafer, the carbon concentration reaches a peak at the bonded interface between the active layer wafer (SOI layer) and the oxide film insulating layer), where a carbon (C) concentration peak of $2 \times 10^{20}$ atoms/cm$^3$ or more is detected.

On the contrary, if no N-methyl-2-pyrrolidone is contained in the atmosphere, no such a significant carbon (C) concentration peak is detected at any depth (a carbon (C) concentration peak of less than $5 \times 10^{18}$ atoms/cm$^3$ is just detected at the bonded interface), as shown in FIG. 6. In other words, it is only required to adjust the amounts of organics on the surfaces of the wafers before bonding so that a carbon concentration peak of $5 \times 10^{18}$ atoms/cm$^3$ or more is obtained at the bonded interface.

In Step 5, the active layer wafer (SOI layer) 12 is thinned. In this step, the thinning is performed by a conventional method such as machining or chemical etching to achieve a bonded SOI wafer 10.

Figure 2:
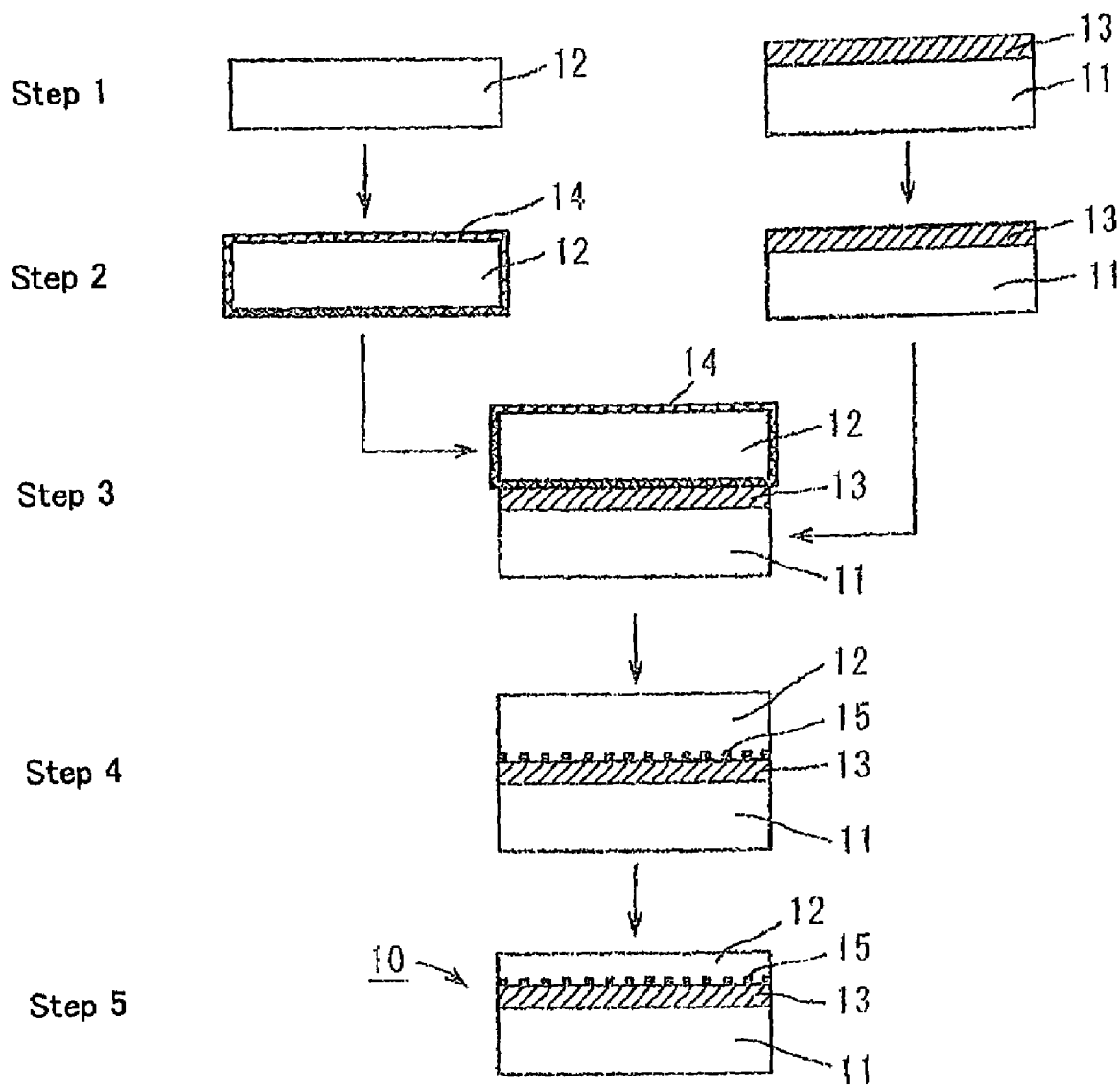
FIG. 2 is a flow chart schematically showing another example of principal steps in the method for manufacturing a bonded SOI wafer according to the present invention.

FIG. 2 is a flow chart schematically showing another example of principal steps in the method for manufacturing a bonded SOI wafer according to the present invention.

The steps in FIG. 2 differ from those shown in FIG. 1 in that for the bonding of the active layer wafer 12 and the supporting wafer 11, organics are provided, that is, a natural oxide film 14 containing carbons is formed only on the surface of the active layer wafer 12 in Step 2.

In Step 3, the active layer wafer 12 with the natural oxide film 14 containing carbons formed on the surface thereof is bonded with the supporting wafer 11 with no natural oxide film 14 containing carbons formed thereon via the oxide film 13 on the supporting wafer 11.

FIG. 3 is a flow chart schematically showing a further example of principal steps in the method for manufacturing a bonded SOI wafer according to the present invention, where for the bonding of the active layer wafer 12 and the supporting wafer 11, organics are provided, that is, a natural oxide film 14 containing carbons is formed only on the surface of the supporting wafer 11.

Specific methods for obtaining the state where the organics exist on the surface of each wafer in Step 2 include cleaning the surface of each wafer in an atmosphere containing the organics before bonding as mentioned above as well as drying the wafer after cleaning in an atmosphere containing the organics. Treating the surface of each wafer with a cleaning solvent containing the organics is also useful. In manufacturing a wafer, not only pre-bonding cleaning but also various kinds of pickling and cleaning are performed to remove impurities and fine particles on the surface of the wafer, and in this case, the pickling solvent or cleaning solvent used therefor contains organics.

Applying or dripping the treating solvent containing the organics onto the surface of each wafer is further applicable. Spreading the treating solvent thinly and evenly on the surface of each wafer by applying a spin coating technique is also useful.

It is noted that in the case of applying such a method, since the attachment of extremely small amounts of organics onto the surface of each wafer also allows crystal defects to be formed, the concentration of the organics is not particularly specified.

Thus, for example, cleaning the surface of each wafer or the surface of the oxide film (insulating layer) formed thereon in an atmosphere containing organics causes a natural oxide film containing small amounts of organics (carbons) to be formed on the surface of each wafer and to be trapped at the interface between the active layer wafer and the supporting wafer, and then performing heat treatment allows micro crystal defects to be formed at the interface between the active layer wafer and the oxide film and at the interface between the supporting wafer and the oxide film.

These crystal defects have a gettering effect of removing process-induced heavy-metal impurities from the active regions of the integrated circuits. This can be confirmed by an improvement in the withstand voltage characteristics of the oxide film in a device that is formed on the surface of an SOI layer in an SOI wafer manufactured by the above-described method.

As described heretofore, in accordance with the method for manufacturing a bonded SOI wafer according to the present invention, a simple and inexpensive gettering source can be formed at the interface between the active layer wafer (SOI layer) and the insulating layer (oxide film) without adding a particular process.

Next will be described a bonded SOI wafer according to the present invention.

The bonded SOI wafer is manufactured by the above-described method according to the present invention, in which the bonded interface includes carbon-induced micro crystal defects. The crystal defects at the bonded interface are carbon-induced as described with reference to Table 1 and FIGS. 4A and 4B and 5.

In the bonded SOI wafer, the crystal defects are extremely small as schematically shown in the foregoing FIGS. 4A and 4B. Therefore, the size of the crystal defects can be set in the range of 5 to 50 nm to thereby characterize the bonded SOI wafer according to the present invention.

The bonded SOI wafer according to the present invention, which have micro crystal defects, can effectively remove heavy-metal impurities that may have a negative impact on the characteristics of the device and/or the withstand voltage characteristics of the oxide film.

The bonded SOI wafer according to the present invention also has a highly characteristic carbon concentration distribution in which a carbon concentration peak of $5 \times 10^{18}$ atoms/$cm^3$ or more is detected at the bonded interface as shown in FIG. 5. That is, the carbon concentration peak at the bonded interface can be set to thereby characterize the bonded SOI wafer according to the present invention.

EXAMPLES

Bonded SOI wafers were produced by applying the method according to the present invention to verify the effects of the method for manufacturing a bonded SOI wafer according to the present invention.

First Example

A bonded SOI wafer was produced as follows in accordance with the steps of the flow chart shown in FIG. 1.

That is, an active layer wafer 12 to be an SOI layer and a supporting wafer 11 with an oxide film 13 having a thickness of 1.0 μm formed on the surface thereof were prepared, and then SC-1 cleaning before bonding was performed on the surface of at least one of the wafers (here indicating both the active layer wafer 12 and the supporting wafer 11) in an atmosphere containing N-methyl-2-pyrrolidone as organics. In the SC-1 cleaning, chemicals were added to the cleaning solvent and the cleaning solvent was circulated through a filter so that the concentration of ammonium hydroxide and hydrogen peroxide solution was kept constant. It is noted that the temperature of the cleaning solvent was 75 degrees C. and the cleaning time was 10 minutes.

Next, the active layer wafer 12 and the supporting wafer 11 were bonded at room temperature and subsequently heat-treated at a treatment temperature of 1100 degrees C. or more, and then ground and polished to obtain a bonded SOI wafer with the SOI layer being thinned down to 5.0 μm.

Observations of the bonded interface (cross section) in the SOI wafer using a transmission electron microscope (TEM) are schematically shown in FIGS. 4A and 4B. As shown in FIG. 4A, micro crystal defects 15 of 5 to 50 nm in size were formed at the bonded interface between the active layer wafer 12 and the oxide film 13.

Further, the carbon (C) concentration in the SOI wafer measured by secondary ion mass spectrometry (SIMS) is shown in FIG. 5, where a carbon (C) concentration peak of $2 \times 10^{20}$ atoms/$cm^3$ indicating the existence of carbons is detected at the bonded interface between the active layer wafer (SOI layer) and the oxide film.

Meanwhile, as for a comparative SOI wafer being produced under the same conditions as in the first example except that the pre-bonding cleaning on the surfaces of the wafers was performed in an atmosphere containing no N-methyl-2-pyrrolidone, no crystal fault was observed at the bonded interface between the active layer wafer and the oxide film using a transmission electron microscope (TEM) (refer to FIG. 4B) and no carbon was also detected by secondary ion mass spectrometry (SIMS) (refer to FIG. 6).

Second Example

A bonded SOI wafer was produced in accordance with the steps of the flow chart shown in FIG. 2.

The prepared active layer wafer 12 and supporting wafer 11 with an oxide film 13 formed on the surface thereof were the same as in the first example. The other conditions including the method of forming a natural oxide film 14 containing carbons on the surface of at least one wafer (here indicating the active layer wafer 12) were also the same as in the first example.

As the results of observing the bonded interface (cross section) in the produced SOI wafer by means of a transmission electron microscope (TEM) and measuring the carbon (C) concentration by secondary ion mass spectrometry (SIMS), since organics existed only on the surface of the active layer wafer 12 and thereby the amounts of organics were small, it was observed that the carbon concentration peak value was likely to decrease slightly relative to the case of the SOI wafer produced in the above-described first example. However, micro crystal defects 15 of 5 to 50 nm in size were observed and a carbon (C) concentration peak of $1 \times 10^{20}$ atoms/cm$^3$ was detected.

Third Example

A bonded SOI wafer was produced in accordance with the steps of the flow chart shown in FIG. 3.

The prepared active layer wafer 12 and supporting wafer 11 with an oxide film 13 formed on the surface thereof were the same as in the first example. The other conditions including the method of forming a natural oxide film 14 containing carbons on the surface of at least one of the wafers (here indicating the supporting wafer 11) were also the same as in the first example.

As the results of observing the bonded interface (cross section) in the produced SOI wafer by means of a transmission electron microscope (TEM) and measuring the carbon (C) concentration by secondary ion mass spectrometry (SIMS), similar results were obtained to the case of the SOI wafer produced in the above-described first example.

As described heretofore, in accordance with the method for manufacturing a bonded SOI wafer according to the present invention, since the active layer wafer and the supporting wafer are bonded and heat-treated for bonding reinforcement in a state where organics exist on the surface of at least one of the wafers so that crystal defects are formed at the bonded interface, a simple and inexpensive gettering source can be formed at the interface between the SOI layer and the insulating layer (oxide film). Also, the bonded SOI wafer according to the present invention that is manufactured by the method can effectively remove heavy-metal impurities that may have a negative impact on the characteristics of the device and/or the withstand voltage characteristics of the oxide film.

What is claimed is:

1. A method for manufacturing a bonded SOI wafer in which an active layer wafer intended to be an SOI layer and a supporting wafer are bonded via an oxide film therebetween and then said active layer wafer is thinned so that said SOI layer is formed on said oxide film, said method comprising:
bonding in a state where organics exist through cleaning on a surface of said active layer wafer and/or on a surface of said supporting wafer; and
heat-treating for bonding reinforcement in a state where said organics are trapped at an interface between said active layer wafer and said supporting wafer to form crystal defects, which have a gettering effect, at an interface between said active layer wafer and said oxide film and/or at an interface between said supporting wafer and said oxide film.

2. The method for manufacturing a bonded SOI wafer according to claim 1, wherein the state where organics exist on the surface of said active layer wafer and/or on the surface of said supporting wafer is obtained by cleaning the surface of said active layer wafer and/or the surface of said supporting wafer in an atmosphere containing said organics.

3. The method for manufacturing a bonded SOI wafer according to claim 1, wherein the state where organics exist on the surface of said active layer wafer and/or on the surface of said supporting wafer is obtained by drying said active layer wafer and/or said supporting wafer after cleaning in an atmosphere containing said organics.

4. The method for manufacturing a bonded SOI wafer according to claim 1, wherein the state where organics exist on the surface of said active layer wafer and/or on the surface of said supporting wafer is obtained by treating said surface of said active layer wafer and/or said surface of said supporting wafer with a cleaning solvent containing said organics.

5. The method for manufacturing a bonded SOI wafer according to claim 1, wherein a state where organics exist on a surface of said active layer wafer and/or on a surface of said supporting wafer is obtained by applying or dripping a treating solvent containing said organics onto the surface of said active layer wafer and/or onto the surface of said supporting wafer.

6. The method for manufacturing a bonded SOI wafer according to claim 1, wherein the state where organics exist on the surface of said active layer wafer and/or on the surface of said supporting wafer is obtained by leaving said active layer wafer and/or said supporting wafer in an atmosphere containing said organics.

7. A bonded SOI wafer manufactured by the method according to claim 1, wherein the interface between said active layer wafer and said oxide film and/or the interface between said supporting wafer and said oxide film includes carbon-induced micro crystal defects.

8. The bonded SOI wafer according to claim 7, wherein said crystal defects have a size of 5 to 50 nm.

9. The bonded SOI wafer according to claim 7, wherein a carbon concentration peak of $5 \times 10^{18}$ atoms/cm$^3$ or more is detected at the interface between said active layer wafer and said oxide film and/or at the interface between said supporting wafer and said oxide film.

10. A bonded SOI wafer manufactured by the method according to claim 2, wherein the interface between said active layer wafer and said oxide film and/or the interface between said supporting wafer and said oxide film includes carbon-induced micro crystal defects.

11. The bonded SOI wafer according to claim 10, wherein said crystal defects have a size of 5 to 50 nm.

12. The bonded SOI wafer according to claim 10, wherein a carbon concentration peak of $5 \times 10^{18}$ atoms/cm$^3$ or more is detected at the interface between said active layer wafer and said oxide film and/or at the interface between said supporting wafer and said oxide film.

13. A bonded SOI wafer manufactured by the method according to claim 3, wherein the interface between said active layer wafer and said oxide film and/or the interface said supporting wafer and said oxide film includes carbon-induced micro crystal defects.

14. The bonded SOI wafer according to claim 13, wherein said crystal defects have a size of 5 to 50 nm.

15. The bonded SOI wafer according to claim 13, wherein a carbon concentration peak of $5 \times 10^{18}$ atoms/cm$^3$ or more is detected at the interface between said active layer wafer and said oxide film and/or at the interface between said supporting wafer and said oxide film.

16. A bonded SOI wafer manufactured by the method according to claim 4, wherein the interface between said active layer wafer and said oxide film and/or the interface between said supporting wafer and said oxide film includes carbon-induced micro crystal defects.

17. The bonded SOI wafer according to claim 16, wherein said crystal defects have a size of 5 to 50 nm.

18. The bonded SOI wafer according to claim 16, wherein a carbon concentration peak of $5 \times 10^{18}$ atoms/cm$^3$ or more is detected at the interface between said active layer wafer and said oxide film and/or at the interface between said supporting wafer and said oxide film.

19. A bonded SOI wafer manufactured by the method according to claim 5, wherein the interface between said active layer wafer and said oxide film and/or the interface between said supporting wafer and said oxide film includes carbon-induced micro crystal defects.

20. The bonded SOI wafer according to claim 19, wherein said crystal defects have a size of 5 to 50 nm.

21. The bonded SOI wafer according to claim 19, wherein a carbon concentration peak of $5 \times 10^{18}$ atoms/cm$^3$ or more is detected at the interface between said active layer wafer and said oxide film and/or at the interface between said supporting wafer and said oxide film.

22. A bonded SOI wafer manufactured by the method according to claim 6, wherein the interface between said active layer wafer and said oxide film and/or the interface between said supporting wafer and said oxide film includes carbon-induced micro crystal defects.

23. The bonded SOI wafer according to claim 22, wherein said crystal defects have a size of 5 to 50 nm.

24. The bonded SOI wafer according to claim 22, wherein a carbon concentration peak of $5 \times 10^{18}$ atoms/cm$^3$ or more is detected at the interface between said active layer wafer and said oxide film and/or at the interface between said supporting wafer and said oxide film.

\* \* \* \* \*